United States Patent
Ritter et al.

(10) Patent No.: US 9,326,417 B2
(45) Date of Patent: *Apr. 26, 2016

(54) CABLE BACKPLANE SYSTEM HAVING MOUNTING BLOCKS

(71) Applicant: Tyco Electronics Corporation, Berwyn, PA (US)

(72) Inventors: Christopher David Ritter, Hummelstown, PA (US); Robert Paul Nichols, Vacaville, CA (US); Brian Patrick Costello, Scotts Valley, CA (US); Joshua Tyler Sechrist, Etters, PA (US); Nathan Glenn Lehman, Harrisburg, PA (US)

(73) Assignee: Tyco Electronics Corporation, Berwyn, PA (US)

( * ) Notice: Subject to any disclaimer, the term of this patent is extended or adjusted under 35 U.S.C. 154(b) by 207 days.

This patent is subject to a terminal disclaimer.

(21) Appl. No.: 14/026,830

(22) Filed: Sep. 13, 2013

(65) Prior Publication Data

US 2015/0075856 A1    Mar. 19, 2015

(51) Int. Cl.
*H05K 1/11* (2006.01)
*H05K 1/14* (2006.01)
*H05K 7/14* (2006.01)
*H04Q 1/02* (2006.01)
*H04Q 1/06* (2006.01)

(52) U.S. Cl.
CPC .............. *H05K 7/1491* (2013.01); *H04Q 1/06* (2013.01); *H04Q 1/09* (2013.01); *H04Q 1/15* (2013.01); *H05K 7/1449* (2013.01)

(58) Field of Classification Search
USPC ................................... 361/788, 785; 174/261
See application file for complete search history.

(56) References Cited

U.S. PATENT DOCUMENTS

| 6,748,458 B2 * | 6/2004 | Andrewartha et al. ........... 710/2 |
| 2012/0164878 A1 * | 6/2012 | Yi et al. ..................... 439/540.1 |

* cited by examiner

*Primary Examiner* — Andargie M Aychillhum

(57) ABSTRACT

A cable backplane system includes a backplane having a plurality of openings extending between a front and a rear of the backplane. The backplane has mounting locations proximate the openings. Mounting blocks are coupled to the front of the backplane at corresponding mounting locations. The mounting blocks are secured to the backplane by fasteners. A cable rack is coupled to the rear of the backplane and has a tray with a frame surrounding a raceway and spacers coupled to the tray. The spacers hold corresponding cable connectors and are secured to corresponding mounting blocks to position the spacers and cable connector assemblies relative to the backplane. The cable connectors are received in corresponding openings in the backplane and are held in position relative to the backplane by the spacers and mounting blocks.

20 Claims, 9 Drawing Sheets

CABLE BACKPLANE SYSTEM HAVING MOUNTING BLOCKS

BACKGROUND OF THE INVENTION

The subject matter herein relates generally to a cable backplane system for interconnecting electrical components in a communication system.

Communication systems, such as network systems, servers, data centers, and the like, use large printed circuit boards, known as backplanes, to interconnect midplanes, daughtercards, line cards and/or switch cards. The communication systems use high speed differential connectors mounted to the backplane and high speed differential connectors mounted to the line cards and switch cards to transmit signals therebetween. The backplane interconnects the various connectors using traces along the circuit board.

As the density of the systems increase and requirements for high speed lines increase, the printed circuit boards continue to become larger and the signal integrity inherently degrades as the signals travel further along the entire channel. At least some systems have replaced the traditional backplanes with cable assemblies. The cable assemblies need to be held in predetermined locations for mating with line and switch cards. Packaging of such cable assemblies is difficult, particularly positioning in a condensed structure. Some systems use a backplane board to support and position the cable assemblies, however the backplane boards cannot withstand the forces exerted during assembly and mating of the line and switch cards.

A need remains for a cable backplane system that is capable of withstanding high insertion forces of cable connectors and line and switch cards.

BRIEF DESCRIPTION OF THE INVENTION

In one embodiment, a cable backplane system is provided that includes a backplane having a plurality of openings extending between a front and a rear of the backplane. The backplane has mounting locations proximate the openings. Mounting blocks are coupled to the front of the backplane at corresponding mounting locations. The mounting blocks are secured to the backplane by fasteners. A cable rack is coupled to the rear of the backplane and has a tray with a frame surrounding a raceway and spacers coupled to the tray. The spacers hold corresponding cable connectors and are secured to corresponding mounting blocks to position the spacers and cable connectors relative to the backplane. The cable connectors are received in corresponding openings in the backplane and are held in position relative to the backplane by the spacers and mounting blocks.

Optionally, the mounting blocks may be positioned between corresponding openings. The mounting blocks may be metal and may stiffen the backplane at the mounting locations. The mounting blocks may each include a front and a rear with side walls therebetween. The rear may be mounted to the front of the backplane. The sidewalls may support corresponding cable connectors received in the openings. The front may include lead-in surfaces to the side walls to direct mating of card connectors with the cable connectors assemblies. The mounting blocks may each have a guide pin extending from the rear thereof. The backplane may have guide holes in the mounting locations receiving the guide pins to position the mounting blocks in the mounting locations.

Optionally, the backplane may include threaded bores. The fastener may be threadably coupled to the threaded bores to secure the mounting blocks to the backplane. Optionally, the spacers may include threaded bores. The fasteners may be threadably coupled to the threaded bores of corresponding spacers to secure the mounting blocks to the spacers. The backplane may be captured between the mounting blocks and the spacers.

Optionally, each spacer may include guide pins extending forward therefrom through the backplane. The mounting blocks may include guide openings therethrough. The guide openings may receive the guide pins to align the spacers with the mounting blocks. Each opening in the backplane may be flanked by two mounting blocks. The mounting blocks may cooperate to guide card connectors for mating with the cable connectors received in the corresponding openings.

In another embodiment, a cable backplane system is provided that includes a backplane having a plurality of openings extending between a front and a rear of the backplane. The backplane has mounting locations proximate the openings with guide holes in the mounting locations. Mounting blocks are coupled to the front of the backplane at corresponding mounting locations. Each mounting block has a front and a rear and each mounting block has a guide pin extending from the rear that is received in the corresponding guide hole to position the mounting block relative to the mounting location. Each mounting block has a fastener bore receiving a fastener. A cable rack is coupled to the rear of the backplane. The cable rack includes a tray having a frame surrounding a raceway and spacers coupled to the tray. The spacers hold corresponding cable connectors. The spacers are secured to corresponding mounting blocks by the fasteners to position the spacers and cable connectors relative to the backplane. The cable connectors are received in corresponding openings in the backplane and held in position relative to the backplane by the spacers and mounting blocks.

In a further embodiment, a cable backplane system is provided that includes a backplane having a plurality of openings extending between a front and a rear of the backplane. The backplane has mounting locations proximate the openings. Mounting blocks are coupled to the front of the backplane at corresponding mounting locations. A cable rack is coupled to the rear of the backplane. The cable rack includes a tray having a frame surrounding a raceway. Spacers are coupled to the tray and are secured to corresponding mounting blocks using fasteners passing through the circuit board to position the spacers relative to the backplane. Cable connector assemblies are held by corresponding spacers. Each cable connector assembly has a plurality of cables extending between at least two cable connectors. The cables are routed in the raceway and the cable connectors are received in corresponding openings and held in position relative to the backplane by the spacers.

DETAILED DESCRIPTION OF THE INVENTION

Figure 1:
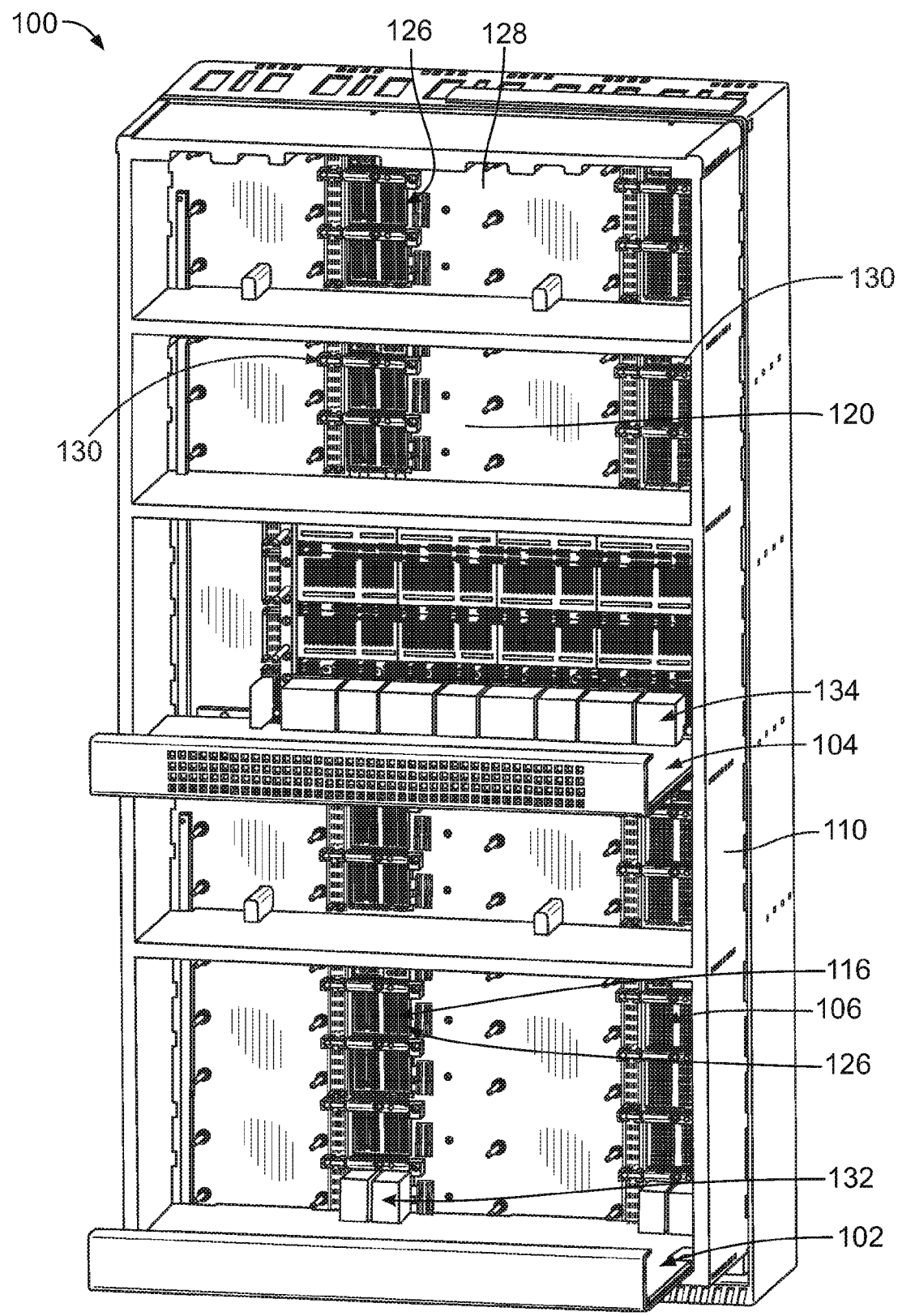
FIG. 1 is a front perspective view of a cable backplane system formed in accordance with an exemplary embodiment.
Figure 2:
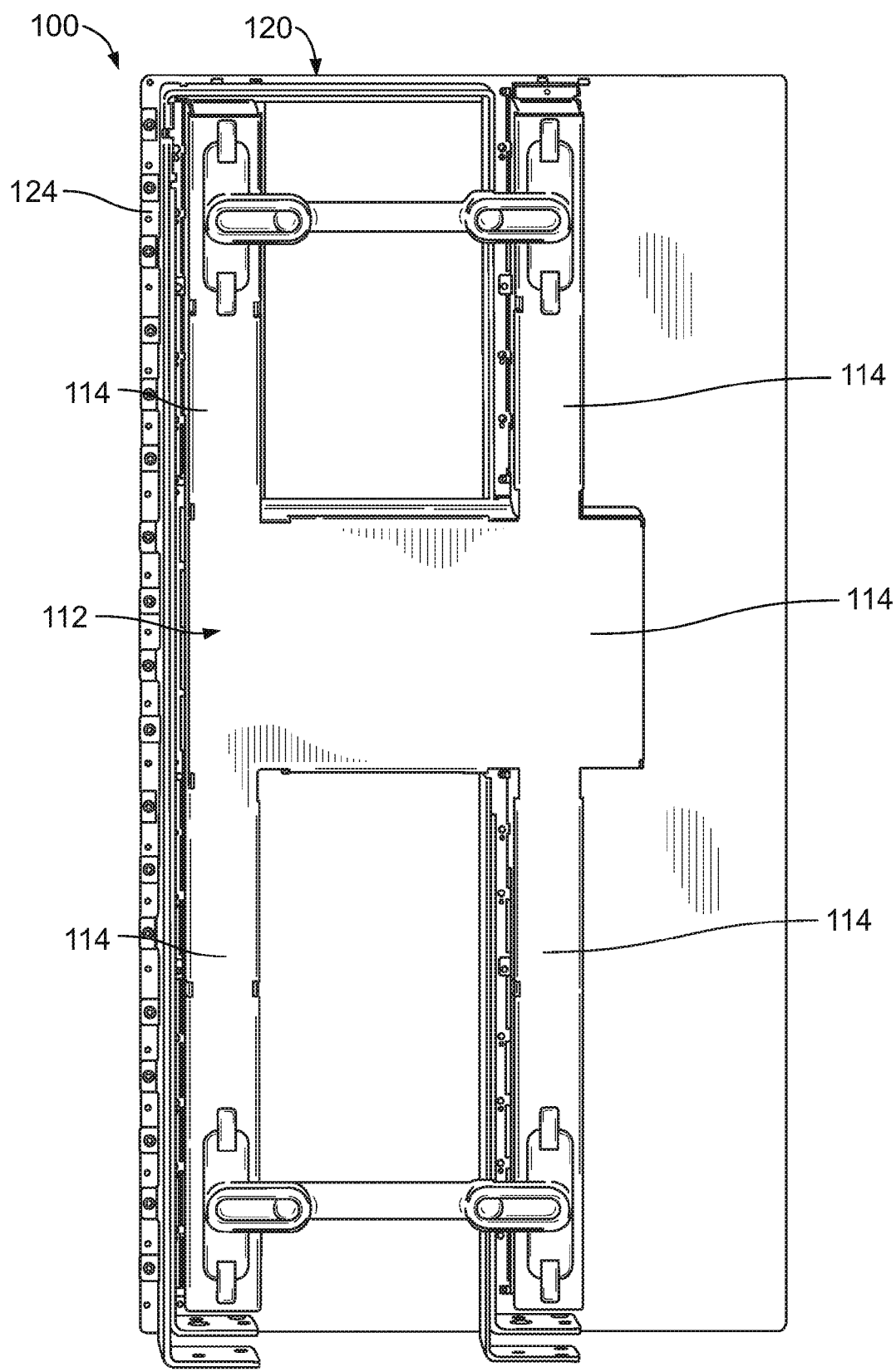
FIG. 2 is a rear perspective view of the cable backplane system.

FIG. 1 is a front perspective view of a cable backplane system 100 formed in accordance with an exemplary embodiment. FIG. 2 is a rear perspective view of the cable backplane system 100. The cable backplane system 100 is used in a data communication application, such as a network switch. The cable backplane system 100 interconnects line cards 102 and switch cards 104 using cable connector assemblies 106. The cable backplane system 100 may be used to interconnect with other types of connectors and/or cards, such as daughtercards, in other embodiments.

The cable connector assemblies 106 include cable connectors 116 that are interconnected by cables within the cable backplane system 100. The cable connector assemblies 106 eliminate interconnections via traces of a circuit board, such as a backplane circuit board. The cable connector assemblies 106 have improved signal performance along the signal paths between various connectors of the cable backplane system 100 as compared to conventional backplanes. The cable connector assemblies 106 support higher speeds, longer signal path lengths and lower cost per channel as compared to conventional backplanes. The cable connector assemblies 106 provide shielding of signal lines for improved signal performance. The cable connector assemblies 106 are packaged in a structure that allows accurate cable and connector location for mating with the corresponding line cards 102 and switch cards 104.

The cable backplane system 100 includes a chassis 110 that supports the components of the cable backplane system 100. The chassis 110 may include a rack, a cabinet or other suitable structures for holding the components of the cable backplane system 100. The chassis 110 may include structures for guiding, supporting and/or securing the lines cards 102 and switch cards 104 coupled to the cable backplane system 100.

The cable backplane system 100 includes a cable rack 112 (shown in FIG. 2) that supports and/or manages the cables of the cable connector assemblies 106. The cable rack 112 includes a plurality of trays 114 that are held together and extend along different portions of the cable backplane system 100. The trays 114 may be box-shaped and define raceways for the cables. The cable rack 112 supports a plurality of the cable connectors 116 which form parts of the cable connector assemblies 106.

The cable backplane system 100 includes a backplane 120. The backplane 120 may be a circuit board and may be manufactured from typical circuit board material, such as FR-4 material. Electrical components, such as power supplies, fans, connectors, and the like may be attached to the backplane 120. Such electrical components may be electrically connected to traces of the backplane 120. The backplane 120 may be manufactured from other materials in alternative embodiments, such as another dielectric material or a metal material, such as a metal sheet, such as when no electrical routing on the backplane 120 is required. The cable connectors 116 are not electrically connected to the backplane 120, as is typical of conventional backplanes, but rather the cable connectors 116 are interconnected by cables extending between the cable connectors 116.

The backplane 120 and cable rack 112, with the cable connector assemblies 106, are coupled together to form the cable backplane system 100. The cable rack 112 is provided along a rear 124 of the backplane 120. The cable connectors 116 extend through openings 126 in the backplane 120 and are presented at a front 128 of the backplane 120 for mating with the line and switch cards 102, 104.

In an exemplary embodiment, a plurality of mounting blocks 130 (shown in FIG. 1) are provided along the front 128 of the backplane 120. Alternatively, the mounting blocks 130 could be provided along the rear 124 in addition to, or in the alternative to, the front 128. The mounting blocks 130 stiffen the backplane 120 in the mounting locations to withstand forces exerted on the backplane 120, such as pressure against the backplane 120 during assembly of the cable rack 112 to the backplane 120, mating forces when the line and switch cards 102, 104 are mated to the cable connectors 116, or other forces. The mounting blocks 130 provide a structure to which the cable rack 112 may be coupled. For example, individual spacers 220, 222, 224, 226 (shown in FIG. 6) may be coupled to corresponding mounting blocks 130 to rigidly secure the cable rack 112 to the backplane 120. The spacers 220, 222, 224 and/or 226 may be provided at each cable connector 116 location such that the cable rack 112, proximate to each cable connector 116, is securely held against the backplane 120, making connection to the line and switch cards 102, 104 easier and more accurate. Proper positioning of the cable connectors 116 may reduce mis-alignment and/or damage to the cable connectors 116. The mounting blocks 130 may be used to guide mating of the line and switch cards 102, 104 with the cable connectors 116.

In an exemplary embodiment, the cable rack 112 is flexible to allow the cable connectors 116 to align with and pass through the openings 126. Optionally, portions of the trays 114 may pass through the openings 126 with the cable connectors 116. The cable connectors 116 and front portions of the trays 114 that extend through the openings 126 may be guided into position by the mounting blocks 130 forward of the backplane 120. The trays 114 may float relative to each other to properly align the cable connectors 116 with the corresponding openings 126. The backplane 120 and mounting blocks 130 hold the cable connectors 116 in precise locations for mating with the line and switch cards 102, 104. The backplane 120 and mounting blocks 130 have tight tolerances to control mating with the line and switch cards 102, 104. The cable rack 112 is flexible to allow the trays 114 to be properly aligned relative to the backplane 120. In an exemplary embodiment, the cable connectors 116 float relative to one another and relative to the trays 114 to allow precise positioning of the cable connectors 116 between the mounting blocks 130 for mating with the line and switch cards 102, 104.

The line and switch cards 102, 104 have card connectors 132, 134, respectively, that mate with corresponding cable connectors 116. The cable connectors 116 need to be precisely positioned relative to the backplane 120 for mating with corresponding card connectors 132, 134. The mounting blocks 130 position the cable connectors 116 for mating with the card connectors 132, 134. In an exemplary embodiment, the mounting blocks 130 guide the card connectors 132, 134 into proper position for mating with the cable connectors 116.

Figure 3:
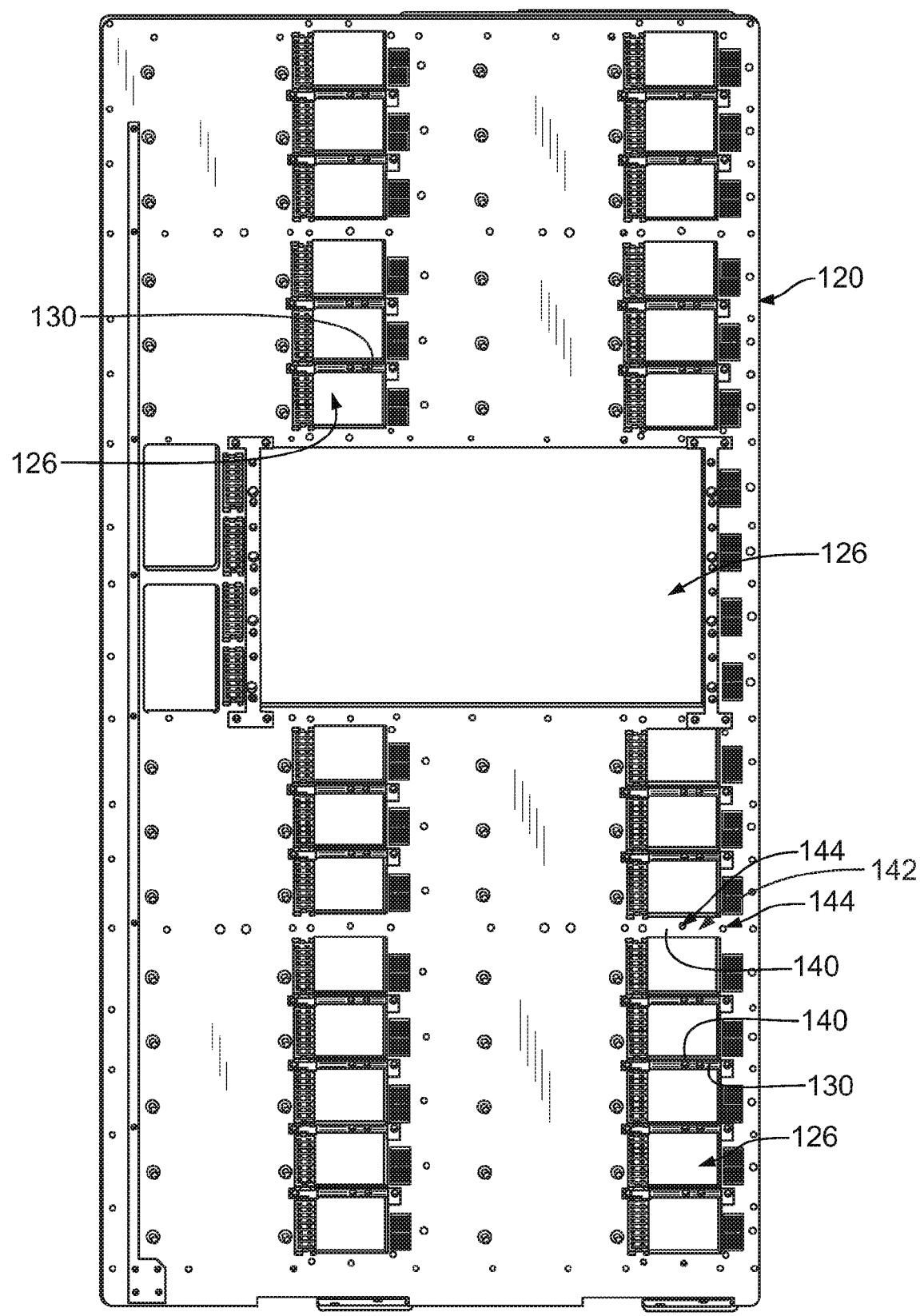
FIG. 3 illustrates a backplane of the cable backplane system and formed in accordance with an exemplary embodiment.

FIG. 3 illustrates the backplane 120 formed in accordance with an exemplary embodiment. The backplane 120 includes the openings 126 that receive the cable connectors 116 and/or portions of the trays 114 (both shown in FIG. 1). The openings 126 may be single openings that receive single cable connectors 116, such as the cable connectors 116 associated with the line cards 102 (shown in FIG. 1). The openings 126 may be large openings that receive multiple cable connectors 116, such as the cable connectors associated with the switch cards 104 (shown in FIG. 1).

The backplane 120 includes crossbars 140 between adjacent openings 126. The crossbars 140 provide support for the backplane 120. The crossbars 140 provide a mounting location 142 for the mounting blocks 130. Optionally, mounting blocks 130 may be provided at each crossbar 140. Mounting blocks 130 may be provided adjacent each opening 126. The mounting blocks 130 are rigid and may stiffen the structure of the backplane 120. For example, because many holes or openings are provided in the structure of the backplane 120, such as to receive the cable connectors 116 (shown in FIG. 1) or other components, such as power components, airflow system components and the like, the mounting blocks 130 add structural strength and rigidity to the backplane 120. The mounting blocks 130 may be metal stiffeners separately fabricated from the backplane 120 and attached to the backplane 120.

The backplane 120 includes holes 144 therethrough that receive guide features, fasteners or other components used to assemble the cable backplane system 100. The holes 144 may define guide holes (which may be referred to hereinafter as guide holes 144) that receive guide features such as guide pins of the mounting blocks 130, the spacers 220, 222, 224 and/or 226, the tray 114 (shown in FIG. 2), and the like. The holes 144 may define threaded holes (which may be referred to hereinafter as threaded holes 144) that receive threaded fasteners to secure the mounting blocks 130, the spacers 220, 222, 224 and/or 226 (shown in FIG. 6), the tray 114 (shown in FIG. 2), other components, and the like. The backplane 120 may include component openings therethrough that receive other electrical components, such as power supplies, airflow components, and the like, that are attached to the backplane 120. Some electrical components may be surface mounted to the backplane 120. Optionally, some electrical connectors may be terminated to the backplane 120, such as through-hole mounting to plated vias of the backplane 120 that are electrically connected to conductive traces on layers of the backplane 120.

Figure 4:
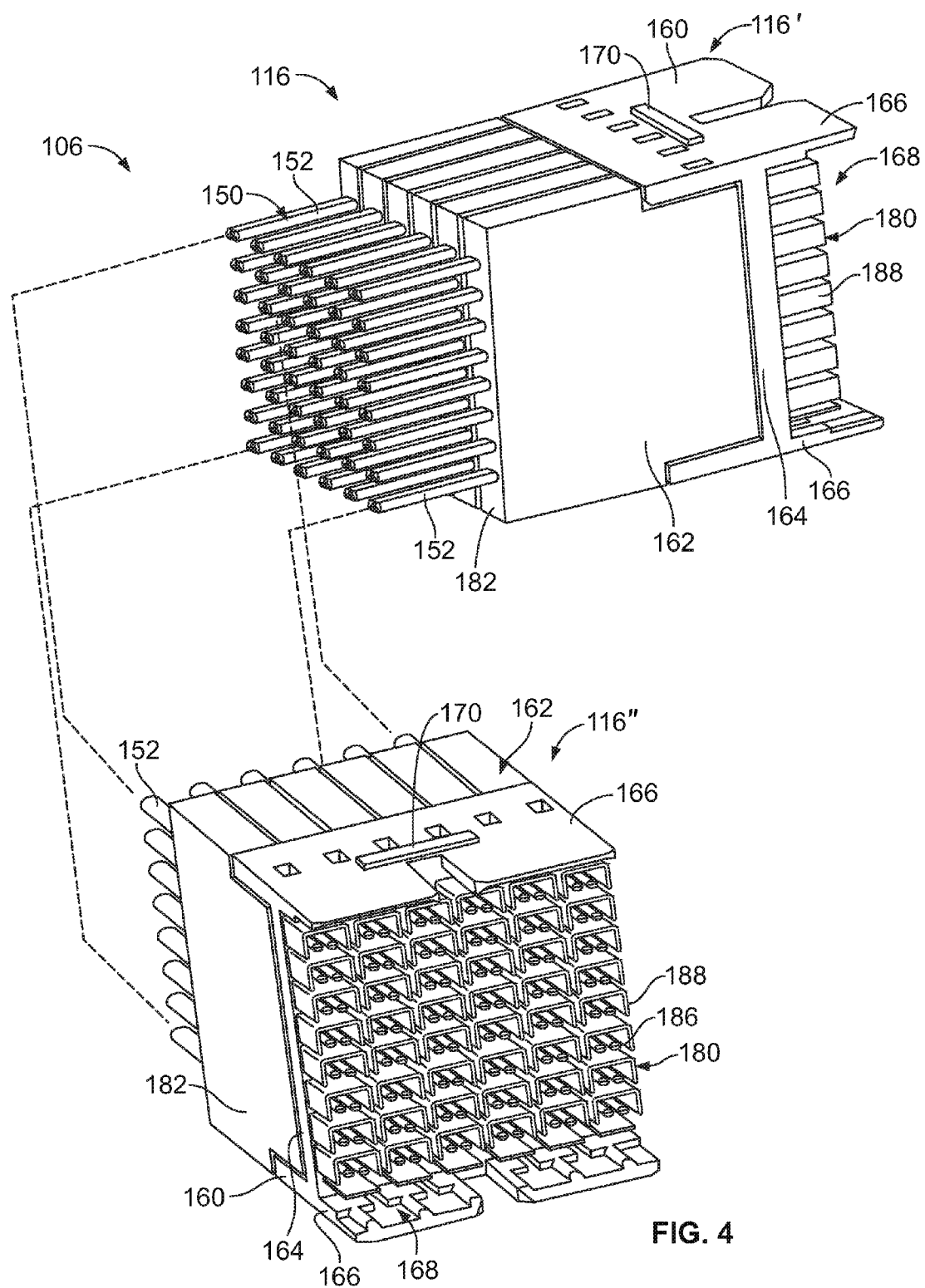
FIG. 4 illustrates a cable connector assembly of the cable backplane system and formed in accordance with an exemplary embodiment.

FIG. 4 illustrates a cable connector assembly 106 formed in accordance with an exemplary embodiment. The cable connector assembly 106 includes a plurality of the cable connectors 116, which may be referred to hereinafter as first and second cable connectors 116', 116", and a cable bundle 150 between the cable connectors 116. The cable connectors 116 are provided at ends of the cable bundle 150. The cable bundle 150 includes a plurality of cables 152. Optionally, the first cable connector 116' may be connected to a card connector 132 (shown in FIG. 1) of a line card 102 (shown in FIG. 1) and the second cable connector 116" may be connected to a card connector 134 (shown in FIG. 1) of the switch card 104 (shown in FIG. 1).

Optionally, the cable connectors 116 may be identical to one another. The cable connectors 116 may define header connectors. The cable connectors 116 are configured to be mated with corresponding card connectors 132, 134, which may be receptacle connectors, such as STRADA Whisper receptacle connectors, commercially available from TE Connectivity, Harrisburg, Pa. In an exemplary embodiment, the cable connector 116 is a high speed differential pair cable connector that includes a plurality of differential pairs of conductors mated at a common mating interface. The differential conductors are shielded along the signal paths thereof to reduce noise, crosstalk and other interference along the signal paths of the differential pairs.

In an exemplary embodiment, the cables 152 are twin axial cables having two signal wires within a common jacket of the cable 152. The signal wires convey differential signals. In an exemplary embodiment, the signal wires are shielded, such as with a cable braid of the cable 152. Optionally, each of the signal wires may be individually shielded. Other types of cables 152 may be provided in alternative embodiments. For example, coaxial cables may extend from the cable connector 116 each carrying a single signal conductor therein.

The cable connector 116 includes a header housing 160 holding a plurality of contact modules 162. The header housing 160 includes a base wall 164 and shroud walls 166 extending from the base wall 164 to define a mating cavity 168 configured to receive the corresponding card connector 132, 134. The shroud walls 166 guide mating of the card connector 132, 134 with the cable connector 116. In an exemplary embodiment, the header housing 160 has lugs 170 extending outward from the walls 166. The lugs 170 are used to locate the cable connector 116 with respect to the corresponding tray 114 (shown in FIG. 2).

Each of the contact modules 162 includes a plurality of cable assemblies 180 held by a support body 182. Each cable assembly 180 includes a pair of signal contacts 186 terminated to corresponding signals wires of the cable 152. Each cable assembly 180 also includes a ground shield 188 providing shielding for the signal contacts 186. In an exemplary embodiment, the ground shield 188 peripherally surrounds the signal contacts 186 along the entire length of the signal contacts 186 to ensure that the signal paths are electrically shielded from interference.

The support body 182 provides support for the cable assemblies 180. The cables 152 extend into the support body 182 such that the support body 182 supports a portion of the cables 152. The support body 182 may provide strain relief for the cables 152. Optionally, the support body 182 may be manufactured from a plastic material. Alternatively, the support body 182 may be manufactured from a metal material. The support body 182 may be a metalized plastic material to provide additional shielding for the cables 152 and the cable assemblies 180. Optionally, the support body 182 may include a metal plate electrically connected to each ground shield 188 to electrically common the ground shields 188, and a dielectric overmold overmolded around the cables 152 and portions of the metal plate to support the cables 152 and cable assemblies 180.

Multiple contact modules 162 are loaded into the header housing 160. The header housing 160 holds the contact modules 162 in parallel such that the cable assemblies 180 are aligned in a column. Any number of contact modules 162 may be held by the header housing 160 depending on the particular application. When the contact modules 162 are stacked in the header housing 160, the cable assemblies 180 may also be aligned in rows.

Figure 5:
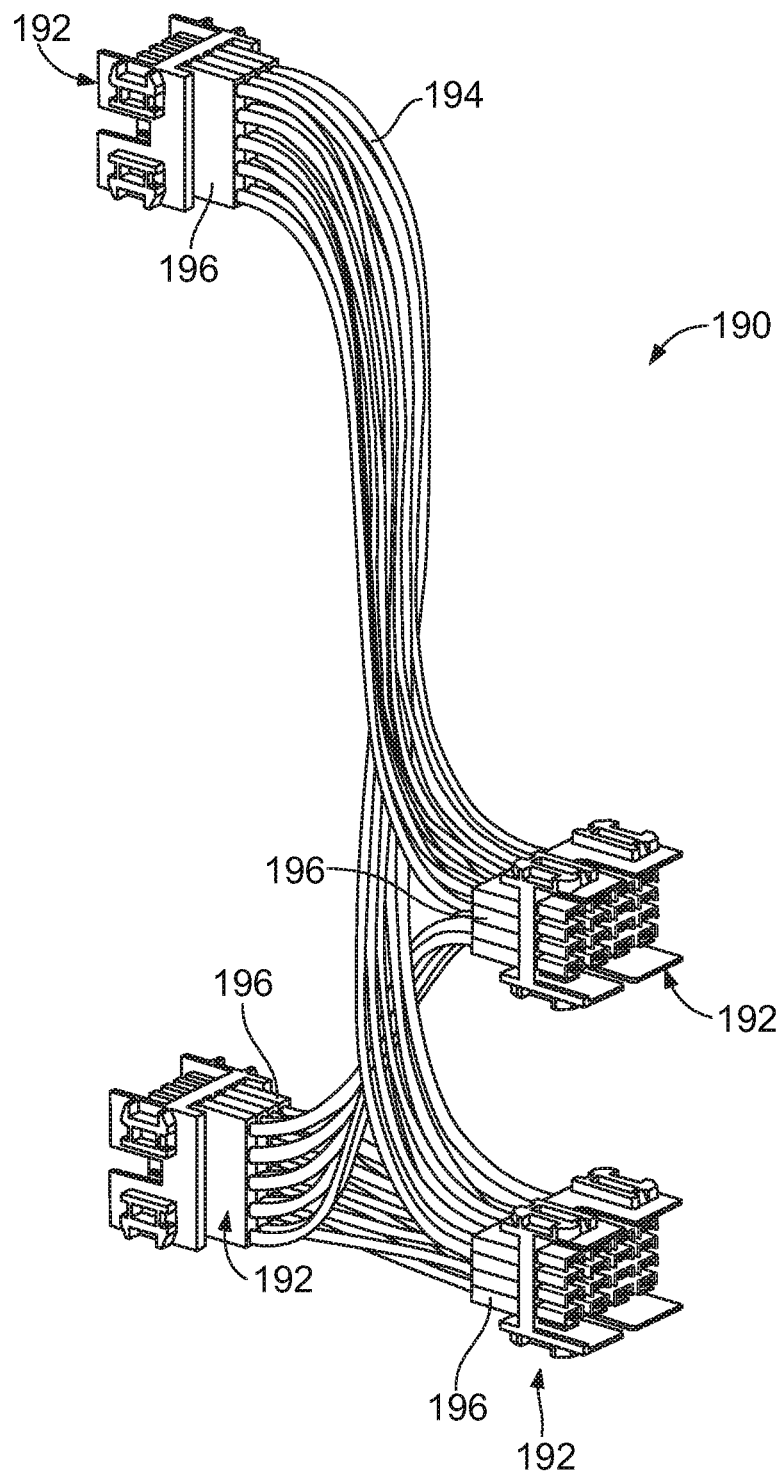
FIG. 5 illustrates a cable connector assembly formed in accordance with an exemplary embodiment.

FIG. 5 illustrates a cable connector assembly 190 formed in accordance with an exemplary embodiment. The cable connector assembly 190 is similar to the cable connector assembly 106 (shown in FIG. 4); however the cable connector assembly 190 includes more cable connectors 192 (e.g. four cable connectors 192 are shown in the embodiment illustrated in FIG. 5). Some of the cable connectors 192 may be used to interconnect with receptacle or card connectors 134 associated with the switch card 104 (both shown in FIG. 1), such as the bottom two cable connectors 192, while other cable connectors 192 may be used to interconnect with receptacle or card connectors 132 associated with the line card 102 (both shown in FIG. 1). Optionally, cables 194 from the same cable connector 192, such as cables from different contact modules 196, may be routed to several other cable connectors 192.

Figure 6:
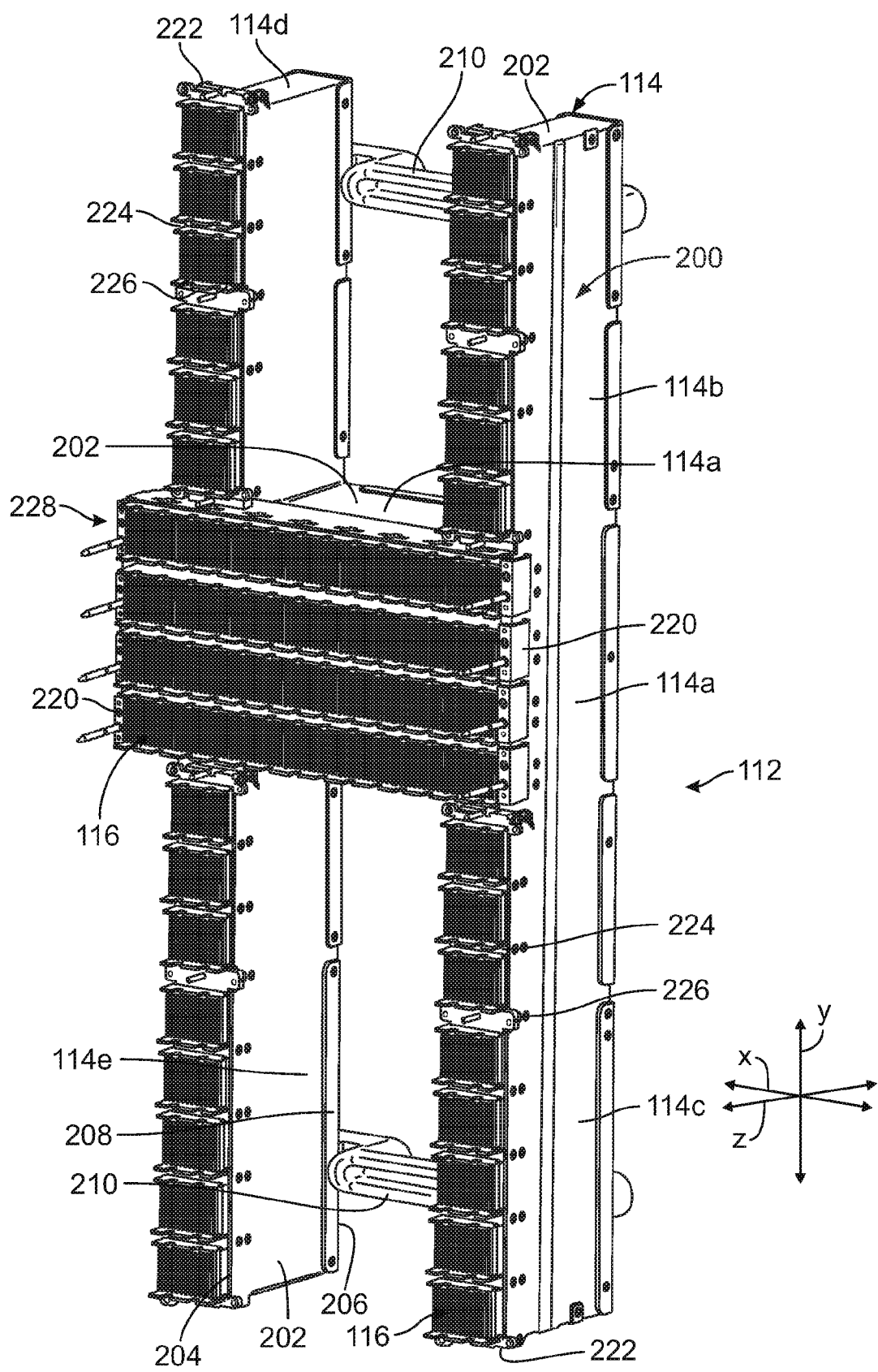
FIG. 6 illustrates a cable rack of the cable backplane system and formed in accordance with an exemplary embodiment.

FIG. 6 illustrates the cable rack 112. The cable rack 112 includes one or more trays 114 connected together to form the cable rack 112. In the illustrated embodiment, the cable rack 112 includes five trays 114a, 114b, 114c, 114d and 114e; however any number of trays 114 may be used in alternative embodiments. The trays 114 are coupled together into an H-shaped configuration having the first tray 114a at a central location with the other trays 114b, 114c, 114d, 114e extending outward from the first tray 114a as legs. The cable rack 112 may have other shapes in alternative embodiments.

In an exemplary embodiment, the first tray 114a is used to hold the cable connectors 116 that are mated with the card connectors 134 of the switch cards 104 (both shown in FIG. 1). The cable connectors 116 in the first tray 114a may be held together as a brick 228. The cable connectors 116 of each brick 228 are connected to the card connectors 134 of the same switch card 104. The other trays 114b, 114c, 114d, 114e are used to hold the cable connectors 116 that are mated with the card connectors 132 of the line cards 102 (both shown in FIG. 1). Optionally, the cable connectors 116 aligned at the same vertical position but in different trays (e.g. 114b and 114d or 114c and 114e) are connected to the card connectors 132 of the same line card 102.

Each tray 114 includes a frame 200 surrounding a raceway through which the cables 152 (shown in FIG. 4) are routed. The raceways are open to one another to allow the cables 152 to be routed from one tray 114 into another tray 114. The frame 200 includes side walls 202 extending between a front edge 204 and a rear 206 of the tray 114. A back wall 208 covers the raceway at the rear 206. The frame 200 is open at the front edge 204 between the side walls 202 to receive the cable connectors 116 therein.

In an exemplary embodiment, the side walls 202 and back wall 208 are sheet metal pieces that are stamped, formed and coupled together, such as using fasteners or other connecting means. The sheet metal may be thin enough to allow the frame 200 to have some flexibility for moving, twisting or otherwise manipulating the trays 114 into position relative to the backplane 120 (shown in FIG. 3) to position the cable connectors 116 in the openings 126 (shown in FIG. 3) in the backplane 120. Optionally, the trays 114 may be connected to each other with some freedom of movement or float built in to the connection to allow the trays 114 to move relative to one another to properly align the cable connectors 116 with the openings 126 in the backplane 120.

In an exemplary embodiment, the cable rack 112 includes handles 210 used to hold the trays 114 together. The handles 210 may be used to pick up the cable rack 112 and load the cable rack 112 onto the backplane 120 during assembly. Because of the size of the cable rack 112, assembly and loading of the cable connectors 116 and/or front edge 204 of the frame 200 into the openings 126 may be difficult. The handles 210 make moving of the cable rack 112 easier. The handles 210 may be removable once the cable rack 112 is coupled to the backplane 120.

The cable rack 112 includes a plurality of spacers 220, 222, 224, 226 used to hold positions of the cable connectors 116. The spacers 220, 222, 224, 226 may be different types of spacers. The spacers 220, 222, 224, 226 may have different sizes, shapes and/or features, such as guide pins. The spacers 220, 222, 224, 226 generally have similar functions, such as supporting one or more cable connectors 116.

In the illustrated embodiment, the spacers 220 are provided along sides of corresponding bricks 228 of cable connectors 116 that are located in the tray 114a. The bricks 228 are a group of cable connectors 116 that are held together in a stacked arrangement for mating with a plurality of the card connectors 134 of the same switch card 104 (both shown in FIG. 1). The spacers 220 may be referred to hereinafter as side spacers 220 or brick spacers 220. The spacers 222 are provided at ends of the trays 114b, 114c, 114d, 114e, such as to support the end-most cable connectors 116 in such trays 114. The spacers 222 may be referred to hereinafter as end spacers 222. The end spacers 222 are provided at the top and bottom ends of the cable rack 112. The end spacers 222 support a single cable connector 116. The spacers 224 are provided between adjacent cable connectors 116. The spacers 224 may be referred to hereinafter as intermediate spacers 224. The spacers 224 each support two cable connectors 116. The spacers 226 are provided between adjacent cable connectors 116, similar to the intermediate spacers 224; however the spacers 226 have guide pins extending therefrom, which may be used for guiding the cable rack 112 into alignment and engagement with the backplane 120. The spacers 226 may be referred to hereinafter as guide spacers 226.

In an exemplary embodiment, the cable connectors 116 are movable relative to the spacers 220, 222, 224, 226 to allow the cable connectors 116 to align with the corresponding openings 126 during assembly of the cable rack 112 and backplane 120. For example, the spacers 220, 222, 224, 226 may allow X, Y and/or Z float to allow fine alignment of the cable connectors 116 with the openings 126. Once the cable connectors 116 are positioned in the openings 126, the spacers 220, 222, 224, 226 may be fixed to the mounting blocks 130 (shown in FIG. 3), such as using fasteners to securely couple the cable rack 112 to the backplane 120 with the cable connectors 116 generally in position for mating with the corresponding card connectors 132, 134. In an exemplary embodiment, the cable connectors 116 are configured to float within the openings 126 relative to the spacers 220, 222, 224, 226 to obtain a true position for aligning to and mating with the corresponding card connectors 132, 134.

Figure 7:
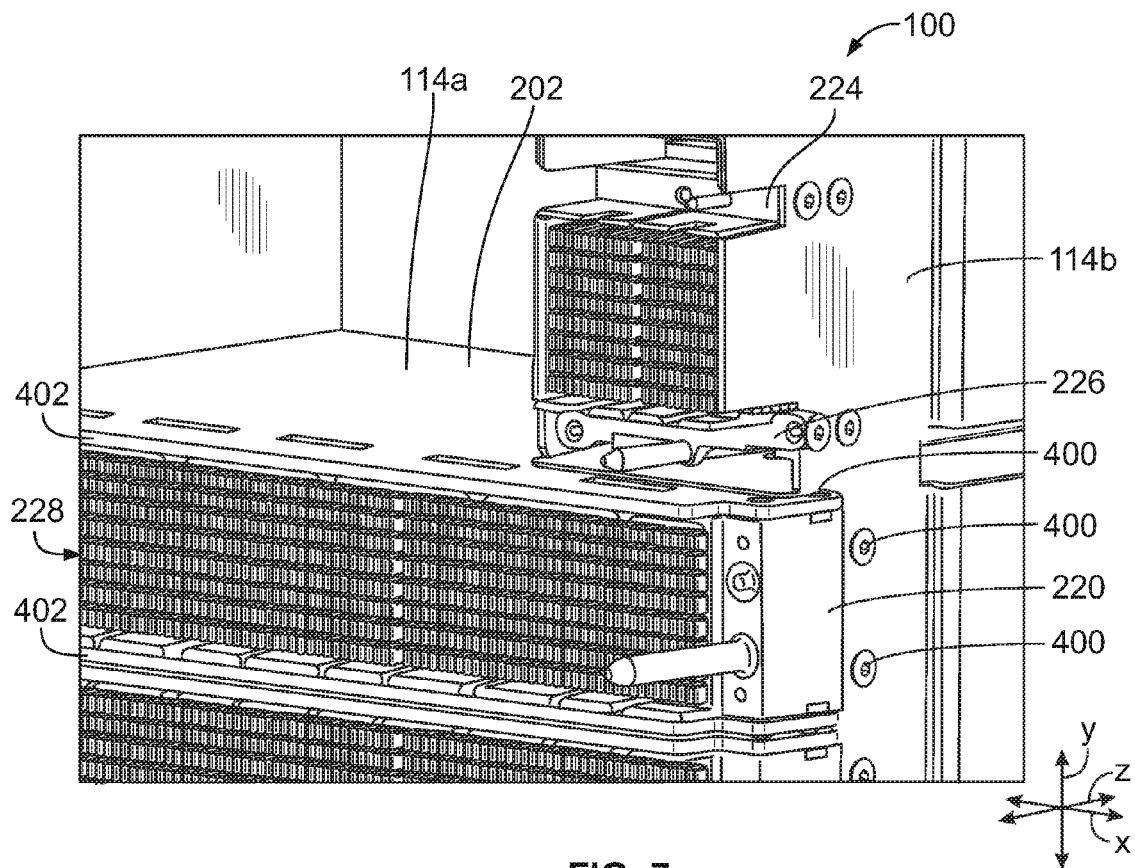
FIG. 7 is a front view of a portion of the cable backplane system.

FIG. 7 is a front view of a portion of the cable backplane system 100. FIG. 7 illustrates the trays 114a, 114b showing the spacers 220, 224, 226 used for mounting the trays 114 to the backplane 120 (shown in FIG. 1). FIG. 7 illustrates the side spacers 220 coupled to the bricks 228, forming part of the first tray 114a. Each brick 228 includes plates 402, which may be top and bottom plates extending along tops and bottoms of the cable connectors 116. The plates 402 hold the cable connectors 116 of the brick 228. The plates 402 may form parts of the side walls 202 of the tray 114a. The side spacers 220 are positioned between the plates 402.

The side spacers 220 are configured to be coupled to corresponding mounting blocks 130 (shown in FIG. 3) on the backplane 120 (shown in FIG. 1). The mounting blocks 130 secure the side spacers 220 in place relative to the backplane 120. However, the side spacers 220 are coupled to the plates 402, and thus the first tray 114a, using float mechanisms 400. The float mechanisms 400 allow movement in mutually perpendicular X, Y and/or Z directions. The side spacers 220 are movable relative to the plates 402 using the float mechanisms 400 to properly position the cable connectors 116 relative to the backplane 120.

In an exemplary embodiment, the first tray 114a is secured to the second tray 114b using float mechanisms 400. The float mechanisms 400 are used to couple the side spacers 220 to the second tray 114*a*. The side spacers 220 are movable relative to the second tray 114*b* using corresponding float mechanisms 400. The first and second trays 114*a*, 114*b* are movable relative to one another using the float mechanisms 400. The float mechanisms 400 allow movement in the X, Y and Z directions. The other trays 114 may be connected together in a similar manner using similar types of float mechanisms 400.

In an exemplary embodiment, the float mechanism 400 is a fastener such as a countersink screw. The float mechanisms 400 may be fasteners that are received in oversized holes or apertures in the trays 114 that allow the float mechanisms 400 to move in one or more directions relative to the trays 114. A circumferential gap may be defined around the float mechanism 400 in the aperture in the side wall 202 allowing the float mechanism 400 to move within the aperture. The size of the gap defines the amount of float. Optionally, the gap may allow approximately 1.0 mm of float in the X, Y and Z directions; however the gap may allow more or less float in alternative embodiments. Other types of float mechanisms may be used in alternative embodiments that tie the trays 114 together but allow limited relative movement therebetween.

Figure 8:
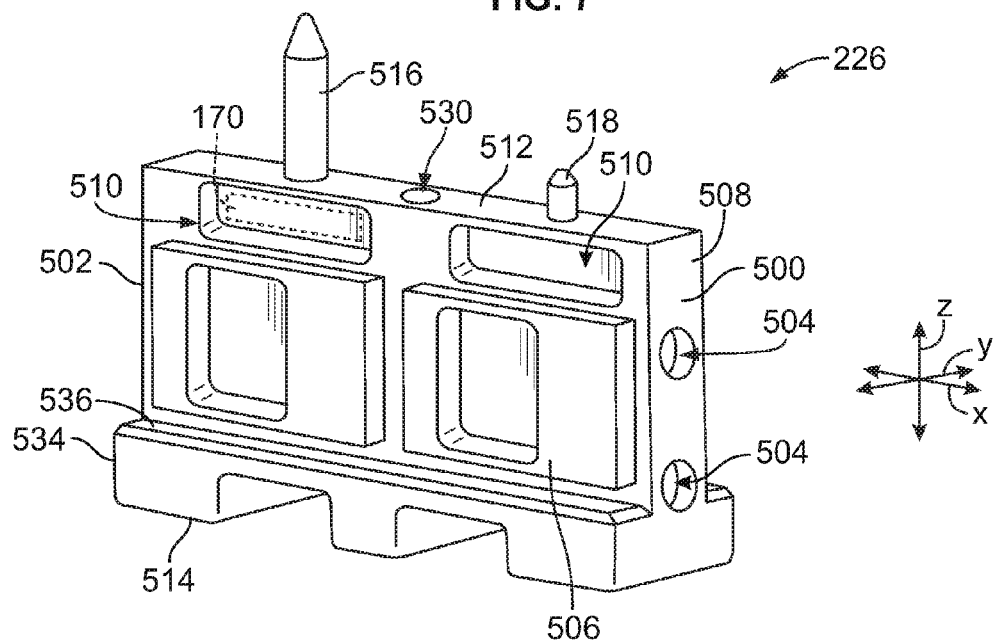
FIG. 8 is a perspective view of one of a spacer formed in accordance with an exemplary embodiment.

FIG. 8 is a perspective view of one of the guide spacers 226 (or simply spacer 226) formed in accordance with an exemplary embodiment. The other spacers 220, 222, 224 (shown in FIG. 6) may include similar features as the spacer 226. The spacer 226 includes first and second ends 500, 502 configured to face corresponding side walls 202 (shown in FIG. 6). The ends 500, 502 have bores 504 that receive fasteners, such as the float mechanisms 400 (shown in FIG. 7). The bores 504 may be threaded to allow the float mechanisms 400 to be threadably coupled to the guide spacer 226.

The spacer 226 includes first and second sides 506, 508 extending between the first and second ends 500, 502. The first and second sides 506, 508 face in opposite directions and are configured to face corresponding cable connectors 116 (shown in FIG. 7). The spacer 226 is configured to support a first cable connector 116 on the first side 506 and a second cable connector 116 on the second side 508. The spacer 226 supports the cable connectors 116 relative to the tray 114 (shown in FIG. 6). In an exemplary embodiment, the spacer 226 supports the cable connectors 116 in a manner that allows the cable connectors 116 to have limited freedom of movement or float relative to the tray 114 to allow proper positioning of the cable connectors 116 for mating with the card connectors 132, 134 (shown in FIG. 1).

The first and second sides 506, 508 have pockets 510 therein that receive corresponding lugs 170 (shown in FIG. 4) of the cable connectors 116. The pockets 510 are oversized as compared to the lugs 170, which allow limited movement of the cable connectors 116 relative to the spacers 226 in one or more directions. The cable connectors 116 are allowed to float relative to the spacers 226 with a predetermined limited amount of movement to allow positioning of the cable connectors 116 relative to the spacers 226, such as to align the cable connectors 116 with the openings 126 (shown in FIG. 1) and/or the card connectors 132, 134.

The spacer 226 includes a front 512 and a rear 514 opposite the front 512. In an exemplary embodiment, the spacer 226 includes guide pins 516, 518 extending from the front 512. The guide pin 516 is longer than the guide pin 518. The guide pin 516 may be used to align the spacer 226 with the mounting block 130 (shown in FIG. 3). For example, the guide pin 516 may pass through one of the holes 144 (shown in FIG. 3) in the backplane 120 and into the mounting block 130. The guide pin 518 may be used to align the spacer 226 with the backplane 120. For example, the guide pin 518 may be received in one of the holes 144 in the backplane 120.

In an exemplary embodiment, the spacer 226 includes a bore 530 in the front 512. The bore 530 may be threaded. A fastener may be used to secure the spacer 226 to the mounting block 130. The spacer 226 may be secured in position relative to the backplane 120 using the fastener. The backplane 120 may be captured between the spacer 226 and the mounting block 130 using the fastener, which extends through the backplane 120 to threadably, or otherwise, couple the spacer 226 to the mounting block 130. Optionally, the fastener may pass through the mounting block 130 and backplane 120 to be threadably coupled to the spacer 226. Alternatively, the fastener may pass through the spacer 226 and backplane 120 to be threadably coupled to the mounting block 130.

The spacer 226 includes a flange 534 proximate to the rear 514. In an exemplary embodiment, the flange 534 extends from the first side 506 and the second side 508; however the flange 534 may extend from only one side 506 or 508 in alternative embodiments. The flange 534 has a forward facing shoulder 536. The forward facing shoulder 536 is used to support the cable connectors 116. For example, the flange 534 is positioned rearward of the cable connectors 116 and supports the cable connectors 116 from retreating from the backplane 102.

Figure 9:
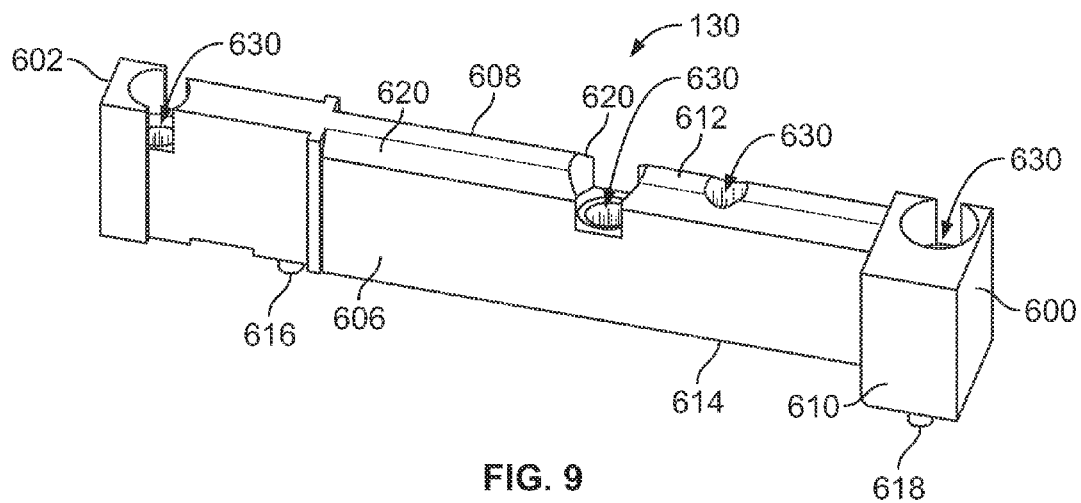
FIG. 9 is a perspective view of one of the mounting blocks formed in accordance with an exemplary embodiment.

FIG. 9 is a perspective view of one of the mounting blocks 130 formed in accordance with an exemplary embodiment. The mounting block 130 extends longitudinally (represented in the X direction shown in FIG. 7) between first and second ends 600, 602. The mounting block 130 includes first and second side walls 606, 608 extending longitudinally between the first and second ends 600, 602. The first and second side walls 606, 608 face in opposite directions and are configured to face corresponding cable connectors 116 (shown in FIG. 7). For example, cable connectors 116 may be loaded into spaces defined beyond the first and second side walls 606, 608. Optionally, the cable connectors 116 may engage the first and/or second side walls 606, 608 when loaded through the openings 126 (shown in FIG. 3) in the backplane 120 (shown in FIG. 3). Optionally, the mounting block may include a foot 610 extending from the first and/or second side walls 606, 608 at the first and/or second ends 600, 602. The foot 610 may provide additional stability for the mounting block 130 on the backplane 120, such as to reduce rocking on the backplane 120.

The mounting block 130 includes a front 612 and a rear 614 opposite the front 612. The rear 614 may be mounted to the backplane 120. Optionally, the rear 614 may abut against and rest on the front 128 (shown in FIG. 1) of the backplane 120. In an exemplary embodiment, the mounting block 130 includes guide pins 616, 618 extending from the rear 614. The guide pins 616, 618 may be received in guide holes 144 (shown in FIG. 3) in the backplane 120 to locate the mounting block 130 in the mounting location 142 (shown in FIG. 3). Optionally, the guide pins 616, 618 may be laterally offset (in the Y direction shown in FIG. 7) for alignment of the mounting block 130 relative to the backplane 120 and/or to reduce torqueing or twisting of the mounting block 130. Any number of guide pins may be used in alternative embodiments.

In an exemplary embodiment, the mounting block 130 includes lead-in surfaces 620 at the front 612 that transition to the side walls 606, 608. The lead-in surfaces 620 are chamfered and may be angled at approximately 45°. The lead-in surfaces 620 may extend along only a portion or portions of the mounting block 130, such as in the area where the card connectors 132, 134 (shown in FIG. 1) are mated with the cable connectors 116. The lead-in surfaces 620 may provide lead-in or guidance for the card connectors 132, 134 during mating with the cable connectors 116.

In an exemplary embodiment, the mounting block 130 includes one or more bores 630 in the front 612 and extending at least partially through the mounting block 130. The bores 630 may be threaded. The bores 630 may be guide bores (which may be referred to hereinafter as guide bores 630) that receive corresponding guide pins from the backplane 120, the spacer 226 (such as guide pin 516 shown in FIG. 8), the card connectors 132, 134 and the like. Optionally, guide bores 630 provide a thru hole for the guide pin and the backplane 120 would have a more tightly controlled hole to perform the positioning while the guide bore 630 only allows for the guide pin to bypass through the mounting block 130.

The bores 630 may be fastener bores (which may be referred to hereinafter as fastener bores 630) that receive fasteners 632 (shown in FIG. 10), such as threaded fasteners. The fastener bores 630 may receive fasteners that are used to threadably couple the mounting block 130 to the backplane 120. The fastener bores 630 may receive fasteners that are used to threadably couple the mounting block 130 to the spacer 226. The fastener bores 630 may receive fasteners that are used to threadably couple the mounting block 130 to the card connectors 132, 134 or to other components. In the illustrated embodiment, the outer fastener bores 630 proximate to the first and second ends 600, 602 receive fasteners that are used to coupled the mounting block 130 to the backplane 120 while the central threaded bore 630 receives a fastener that is used to couple the spacer 226 to the mounting block 130. Other configurations are possible in alternative embodiments.

Figure 10:
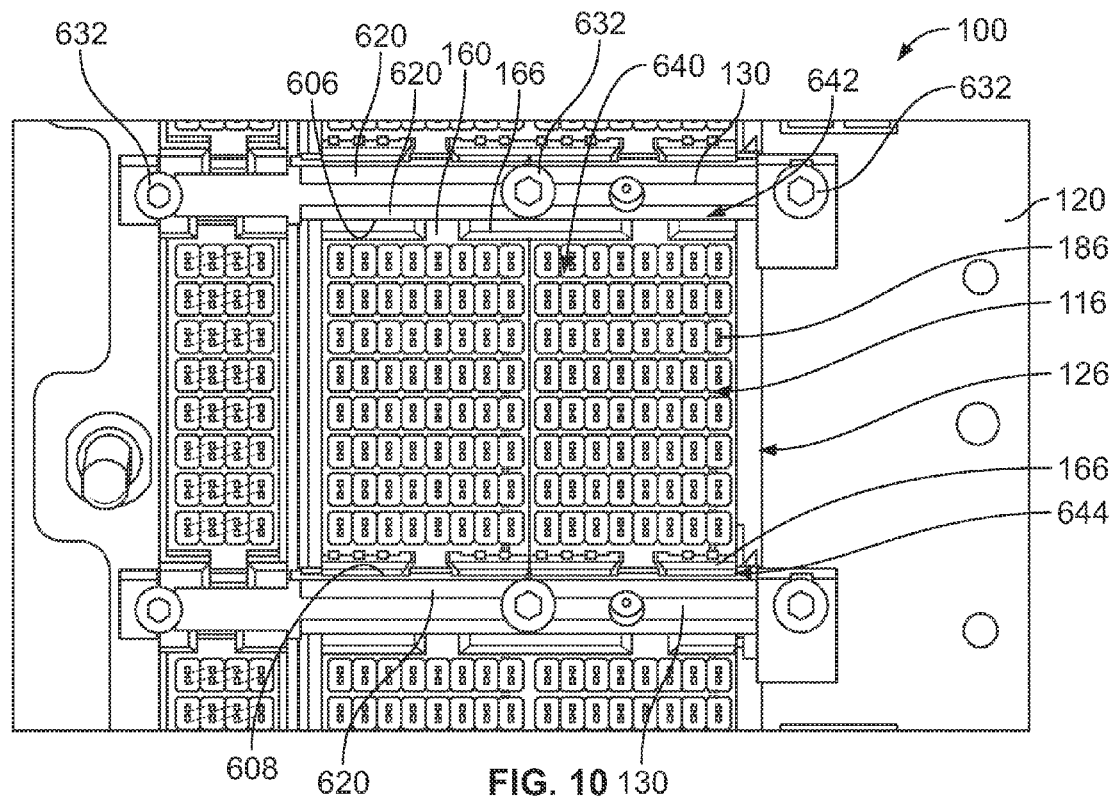
FIG. 10 is a front view of a portion of the cable backplane system showing two mounting blocks flanking opposite sides of a corresponding opening in the backplane.
Figure 11:
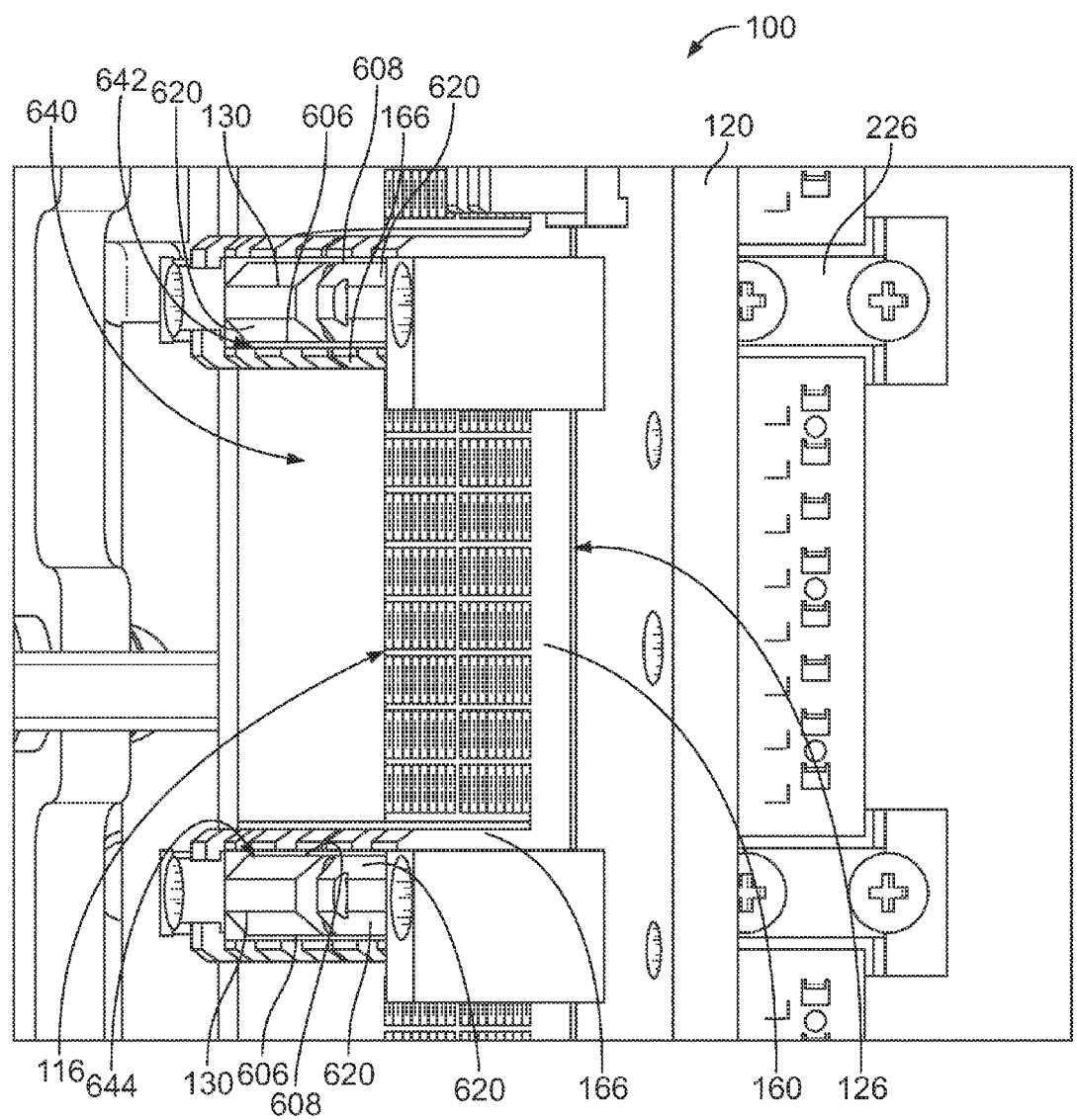
FIG. 11 is a perspective view of a portion of the cable backplane system showing two mounting blocks flanking opposite sides of a corresponding opening in the backplane.

FIG. 10 is a front view of a portion of the cable backplane system 100 showing two mounting blocks 130 flanking opposite sides of a corresponding opening 126 in the backplane 120. FIG. 11 is a perspective view of a portion of the cable backplane system 100 showing two mounting blocks 130 flanking opposite sides of a corresponding opening 126 in the backplane 120. The mounting blocks 130 are secured to the spacers 226 and/or backplane 120 using the fasteners 632 (shown in FIG. 10). A receiving space 640 is defined between the mounting blocks 130. One or more cable connectors 116 are received in the receiving space 640 through the backside of the backplane 120.

The receiving space 640 is configured to receive one or more card connectors 132 or 134 for mating with the cable connector(s) 116. The mounting blocks 130 guide mating of the card connector(s) 132, 134 with the cable connector(s) 116. The lead-in surfaces 620 guide the card connector(s) 132, 134 into the receiving space 640 and toward the cable connector(s) 116. The shroud walls 166 of the header housing 160 extend along the side walls 606, 608. The mounting blocks 130 protect the shroud walls 166. The shroud walls 166 may be chamfered to provide additional lead-in to the signal contacts 186. Optionally, the shroud walls 166 may abut against the side walls 606, 608 of the mounting blocks 130. Alternatively, gaps 642, 644 may be provided between the side walls 606, 608 of the mounting blocks 130 and the cable connectors 116. The gaps 642, 644 may allow the cable connectors 116 to float within the receiving space 640 for aligning with the card connector(s) 132, 134.

Embodiments described herein provide mounting blocks 130 that stiffen the backplane 120 and provide rigid mounting points for the cable connectors 116. For example, the spacers 220 that support the cable assemblies 116 may be fixedly coupled to the mounting blocks 130 to eliminate overstress on the backplane 120. The mounting blocks 130 provide guidance for mating of the card connectors 132, 134 with the cable connectors 116. The mounting blocks 130 form a protective shell around the cable connectors 116 to protect the cable connectors 116 from damage during mating with the card connectors 132, 134. The mounting blocks 130 are arranged along each of the openings 126 in the backplane 120 to surround each of the cable connectors 116.

It is to be understood that the above description is intended to be illustrative, and not restrictive. For example, the above-described embodiments (and/or aspects thereof) may be used in combination with each other. In addition, many modifications may be made to adapt a particular situation or material to the teachings of the invention without departing from its scope. Dimensions, types of materials, orientations of the various components, and the number and positions of the various components described herein are intended to define parameters of certain embodiments, and are by no means limiting and are merely exemplary embodiments. Many other embodiments and modifications within the spirit and scope of the claims will be apparent to those of skill in the art upon reviewing the above description. The scope of the invention should, therefore, be determined with reference to the appended claims, along with the full scope of equivalents to which such claims are entitled. In the appended claims, the terms "including" and "in which" are used as the plain-English equivalents of the respective terms "comprising" and "wherein." Moreover, in the following claims, the terms "first," "second," and "third," etc. are used merely as labels, and are not intended to impose numerical requirements on their objects. Further, the limitations of the following claims are not written in means—plus-function format and are not intended to be interpreted based on 35 U.S.C. §112, sixth paragraph, unless and until such claim limitations expressly use the phrase "means for" followed by a statement of function void of further structure.

What is claimed is:

1. A cable backplane system comprising:
a generally planar substrate defining a backplane having a plurality of openings extending between a front and a rear of the backplane, the front defines a mating interface for mating with circuit cards, the openings receive cable connectors configured to be mated with circuit card connectors of the circuit cards, the backplane having mounting locations proximate the openings;
mounting blocks coupled to the front of the backplane at corresponding mounting locations, the mounting blocks being secured to the backplane by fasteners; and
a cable rack coupled to the rear of the backplane and holding the cable connectors, the cable rack comprising a tray having side walls defining a frame and surrounding a cable raceway for routing cables of the cable connectors, the tray having spacers coupled to the frame between the side walls, the spacers and side walls holding corresponding cable connectors such that the cables are routed through the cable raceway, the spacers being secured to corresponding mounting blocks to position the spacers and the cable connectors relative to the backplane, wherein the cable connectors are received in corresponding openings in the backplane and held in position relative to the backplane by the spacers and the mounting blocks.

2. The cable backplane system of claim 1, wherein the mounting blocks are positioned between corresponding openings.

3. The cable backplane system of claim 1, wherein the mounting blocks are metal and stiffen the backplane at the mounting locations.

4. The cable backplane system of claim 1, wherein the mounting blocks each include a front and a rear with side walls therebetween, the rear of the mounting blocks being mounted to the front of the backplane, the sidewalls supporting corresponding cable connectors received in the openings.

5. The cable backplane system of claim 4, wherein the front of the mounting block includes lead-in surfaces to the side walls to direct mating of card connectors with the cable connectors.

6. The cable backplane system of claim 4, wherein the mounting blocks each have a guide pin extending from the rear thereof, the backplane having guide holes in the mounting locations receiving the guide pins to position the mounting blocks in the mounting locations.

7. The cable backplane system of claim 1, wherein the backplane comprises threaded bores, the fastener being threadably coupled to the threaded bores to secure the mounting blocks to the backplane.

8. The cable backplane system of claim 1, wherein the spacers include threaded bores, the fasteners being threadably coupled to the threaded bores of corresponding spacers to secure the mounting blocks to the spacers.

9. The cable backplane system of claim 1, wherein the backplane is captured between the mounting blocks and the spacers.

10. The cable backplane system of claim 1, wherein each spacer includes guide pins extending forward therefrom through the backplane, the mounting blocks including guide openings therethrough, the guide openings receiving the guide pins to align the spacers with the mounting blocks.

11. The cable backplane system of claim 1, wherein each opening in the backplane is flanked by two mounting blocks, the mounting blocks cooperating to guide card connectors for mating with the cable connectors received in the corresponding openings.

12. A cable backplane system comprising:
a generally planar substrate defining a backplane having a plurality of connector openings extending between a front and a rear of the backplane, the front defines a mating interface for mating with circuit cards, the openings receive cable connectors configured to be mated with circuit card connectors of the circuit cards, the backplane having mounting locations proximate the openings with guide holes in the mounting locations;
mounting blocks coupled to the front of the backplane at corresponding mounting locations, each mounting block having a front and a rear, each mounting block having a guide pin extending from the rear, the guide pin being received in the corresponding guide hole to position the mounting block relative to the mounting location, each mounting block having a fastener bore receiving a fastener; and
a cable rack coupled to the rear of the backplane and holding the cable connectors, the cable rack comprising a tray having side walls defining a frame and surrounding a cable raceway for routing cables of the cable connectors, the tray having spacers coupled to the frame between the side walls, the spacers and side walls holding corresponding cable connectors such that the cables are routed through the cable raceway, the spacers being secured to corresponding mounting blocks by the fasteners to position the spacers and the cable connectors relative to the backplane, wherein the cable connectors are received in corresponding openings in the backplane and held in position relative to the backplane by the spacers and the mounting blocks.

13. The cable backplane system of claim 12, wherein the mounting blocks are positioned between corresponding openings.

14. The cable backplane system of claim 12, wherein each mounting block includes side walls extending between the front and the rear of the mounting block, the front includes lead-in surfaces to the side walls to direct mating of card connectors with the cable connectors assemblies.

15. The cable backplane system of claim 12, wherein the backplane comprises threaded bores, the fastener being threadably coupled to the threaded bores to secure the mounting blocks to the backplane.

16. The cable backplane system of claim 12, wherein the spacers include threaded bores, the fasteners being threadably coupled to the threaded bores of corresponding spacers to secure the mounting blocks to the spacers.

17. A cable backplane system comprising:
a backplane having a plurality of connector openings extending between a front and a rear of the backplane, the front defines a mating interface for mating with circuit cards, the backplane having mounting locations proximate the openings;
mounting blocks coupled to the front of the backplane at corresponding mounting locations; and
a cable rack coupled to the rear of the backplane, the cable rack comprising:
a tray having side walls defining a frame and surrounding a cable raceway;
spacers coupled to the frame between the side walls, the spacers being secured to corresponding mounting blocks using fasteners passing through the circuit board to position the spacers relative to the backplane; and
cable connector assemblies held by corresponding side walls and spacers, each cable connector assembly having a plurality of cables extending between at least two cable connectors, the cables being routed in the cable raceway, the cable connectors being received in corresponding openings and held in position relative to the backplane by the spacers.

18. The cable backplane system of claim 17, wherein the mounting blocks each include a front and a rear with side walls therebetween, the rear being mounted to the front of the backplane, the side walls supporting corresponding cable connectors received in the openings.

19. The cable backplane system of claim 18, wherein the front includes lead-in surfaces to the side walls to direct mating of card connectors with the cable connectors assemblies.

20. The cable backplane system of claim 18, wherein the mounting blocks each have a guide pin extending from the rear thereof, the backplane having guide holes in the mounting locations receiving the guide pins to position the mounting blocks in the mounting locations.

* * * * *